United States Patent
Wu

(10) Patent No.: US 10,690,980 B2
(45) Date of Patent: Jun. 23, 2020

(54) ARRAY SUBSTRATE AND DRIVING METHOD THEREOF AND LIQUID CRYSTAL PANEL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Yu Wu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/748,780

(22) PCT Filed: Jan. 10, 2018

(86) PCT No.: PCT/CN2018/072075
§ 371 (c)(1),
(2) Date: Jan. 30, 2018

(87) PCT Pub. No.: WO2019/119562
PCT Pub. Date: Jun. 27, 2019

(65) Prior Publication Data
US 2019/0187526 A1   Jun. 20, 2019

(30) Foreign Application Priority Data

Dec. 18, 2017   (CN) .............................. 201711366972

(51) Int. Cl.
*G09G 3/36* (2006.01)
*G02F 1/1362* (2006.01)
*H01L 27/12* (2006.01)

(52) U.S. Cl.
CPC ..... *G02F 1/136286* (2013.01); *G09G 3/3607* (2013.01); *G09G 3/3677* (2013.01);
(Continued)

(58) Field of Classification Search
CPC ............. G09G 3/36; G09G 2300/0426; G09G 2310/027; G09G 2310/0286;
(Continued)

(56) References Cited

U.S. PATENT DOCUMENTS 9,886,924 B2    2/2018 Zhu
2003/0151584 A1*  8/2003 Song ................... G09G 3/3607
345/100

(Continued)

FOREIGN PATENT DOCUMENTS

| CN | 102646404 A | 8/2012 |
| CN | 103634585 A | 3/2014 |
| JP | 2011-158798 A | 8/2011 |

*Primary Examiner* — Lunyi Lao
*Assistant Examiner* — Jarurat Suteerawongsa
(74) *Attorney, Agent, or Firm* — Hemisphere Law, PLLC; Zhigang Ma

(57) ABSTRACT

An array substrate and a driving method thereof and a liquid crystal panel are provided. The array substrate includes plural scan lines, plural data lines and plural sub-pixels that are arranged in a matrix and are defined by the scan lines and the data lines, in which every two rows of sub-pixels constitutes a unit, sub-pixels in the same column and in the same unit are connected to the same data line, sub-pixels in the same column but respectively in two adjacent units are connected to different data lines, two adjacent columns of sub-pixels in the same unit are connected to different data lines, and two scan lines in the same unit are conducted at the same time.

5 Claims, 2 Drawing Sheets

(52) U.S. Cl.
CPC ... *G09G 3/3688* (2013.01); *G09G 2300/0452* (2013.01); *H01L 27/124* (2013.01)

(58) Field of Classification Search
CPC ... G09G 2310/0289; G09G 2310/0291; G09G 2320/0223; G09G 2320/0242; G09G 3/3607; G09G 3/3677; G09G 3/3688; G09G 2300/0452; G02F 1/136286; H01L 27/124
See application file for complete search history.

(56) References Cited

U.S. PATENT DOCUMENTS

| | | | |
|---|---|---|---|
| 2004/0252098 A1* | 12/2004 | Lee | G09G 3/3648 345/103 |
| 2009/0128466 A1* | 5/2009 | Chung | G09G 3/2096 345/87 |
| 2010/0265410 A1* | 10/2010 | Sugihara | G09G 3/3614 348/731 |
| 2014/0085279 A1* | 3/2014 | Shiomi | G09G 3/2074 345/204 |
| 2015/0170590 A1* | 6/2015 | Ahn | G09G 3/3614 345/96 |
| 2016/0078836 A1* | 3/2016 | Kim | G09G 3/3688 345/209 |

* cited by examiner

US 10,690,980 B2

ARRAY SUBSTRATE AND DRIVING METHOD THEREOF AND LIQUID CRYSTAL PANEL

RELATED APPLICATIONS

The present application is a National Phase of International Application Number PCT/CN2018/072075, filed Jan. 10, 2018, and claims the priority of China Application No. 201711366972.2, filed Dec. 18, 2017.

FIELD OF THE DISCLOSURE

The present invention relates to a liquid crystal display field, and more particularly, to an array substrate and a driving method thereof and a liquid crystal panel.

BACKGROUND

Currently, display technology has been developed from two-dimensional (2D) display to three-dimensional (3D) display. A simplest method of the 3D display technology is that a left eye frame signal and a right eye frame signal are sequentially provided from the front end to the back end and a 3D eyeglass is in synchronization with the frame signals, such that the left lens opens when displaying an left eye image and the right lens opens when displaying a right eye image. In such a way, the human brain synthesizes the left eye image and the right eye image to achieve a 3D effect. To avoid any flicker in the screen, the frame rate should be increased to 120 Hz for each of the left eye frames and the right eye frames to have a frame rate of 60 Hz.

However, data lines of the prior art flip-pixel structure are designed by applying a z-shape layout, and such layout technique would result in transmitting the same data signal to two sub-pixels of different colors to produce cross interferences because the odd and even data lines are conducted simultaneously, which is non-beneficial to 3D display.

SUMMARY

To solve the aforementioned technical problems, the present invention provides an array substrate and a driving method thereof and a liquid crystal panel, which can solve the problems of cross interferences of data signals in the prior art technology and therefore achieve 3D display.

In order to solve the aforementioned technical problems, a first technical solution applied in the present disclosure is to provide an array substrate, which includes plural scan lines, plural data lines and plural sub-pixels that are arranged in a matrix and are defined by the scan lines and the data lines, in which every two rows of sub-pixels constitutes a unit, sub-pixels in the same column and in the same unit are connected to the same data line, sub-pixels in the same column but respectively in two adjacent units are connected to different data lines, two adjacent columns of sub-pixels in the same unit are connected to different data lines, and two scan lines in the same unit are conducted at the same time.

In order to solve the aforementioned technical problems, a second technical solution applied in the present disclosure is to provide a method of driving an array substrate which includes plural scan lines, plural data lines and plural sub-pixels that are arranged in a matrix and are defined by the scan lines and the data lines, in which every two rows of sub-pixels constitutes a unit, sub-pixels in the same column and in the same unit are connected to the same data line, sub-pixels in the same column but respectively in two adjacent units are connected to different data lines, and two adjacent columns of sub-pixels in the same unit connected to different data lines. The method includes simultaneously inputting scan signals to two scan lines corresponding to one unit for the sub-pixels to receive data signals, stopping signal inputting to the two scan lines corresponding to the one of the units, and simultaneously inputting scans signal to two scan lines corresponding to a next one unit for the sub-pixels to receive data signals.

In order to solve the aforementioned technical problems, a third technical solution applied in the present disclosure is to provide a liquid display panel that includes plural scan lines, plural data lines and plural sub-pixels that are arranged in a matrix and are defined by the scan lines and the data lines, in which every two rows of sub-pixels constitutes a unit, sub-pixels in the same column and in the same unit are connected to the same data line, sub-pixels in the same column but respectively in two adjacent units are connected to different data lines, two adjacent columns of sub-pixels in the same unit are connected to different data lines, and two scan lines in the same unit are conducted at the same time.

Embodiments of the present invention have the following beneficial effects. In comparison with the prior art technology, in the array substrate according to the embodiments of the present invention, every two rows of sub-pixels constitutes a unit. By conducting two scan lines in a unit at the same time, disconnecting the two scan lines in the unit, and then conducting two scan lines in a next unit simultaneously, and by transmitting the same data signal to two sub-pixels in the same column and in the same unit according to the embodiments of the present invention, data signals can be correctly transmitted to the sub-pixels of the same color, thereby overcoming cross interferences and enhancing 3D display quality of the liquid crystal panel.

DETAILED DESCRIPTION OF PREFERRED EMBODIMENTS

A clear and complete description will be given to technical solutions of the embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
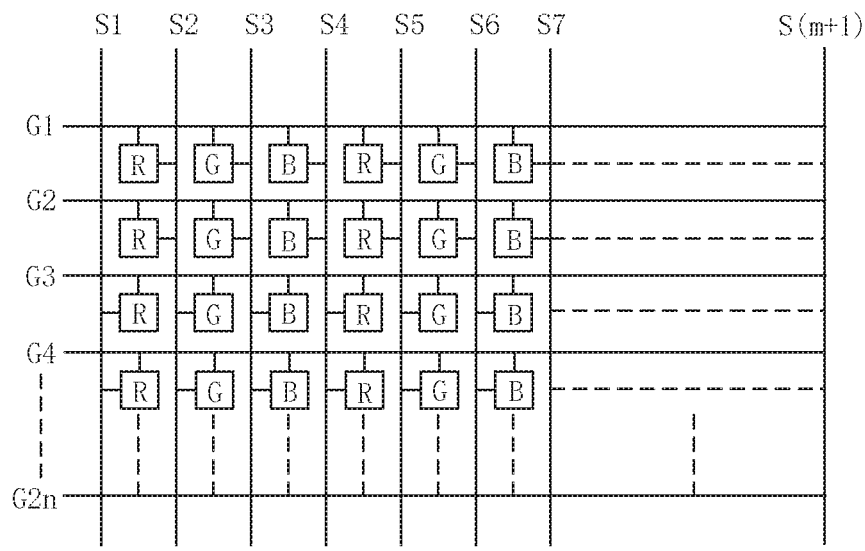
FIG. 1 is a schematic structure diagram of an array substrate according to a first embodiment of the present invention.

Please refer to FIG. 1, FIG. 1 is a schematic structure diagram of an array substrate in accordance with a first embodiment of the present invention. As shown in FIG. 1, the array substrate includes 2n scan lines G1, G2, G3 . . . G2n, m+1 data lines S1, S2, S3 . . . S(m+1) and m columns of sub-pixels that are arranged in a matrix and are defined by the scan lines G1, G2, G3 ... G2n and the data lines S1, S2, S3 ... S(m+1), where m and n are all integers larger than or equal to 2. The sub-pixels are divided into units each having two rows of sub-pixels; that is, a first row of sub-pixels and a second row of sub-pixels constitutes a first unit, and a third row of sub-pixels and a fourth row of sub-pixels constitutes a second unit, and so on, and a $(2n-1)^{th}$ row of sub-pixels and a $(2n)^{th}$ row of sub-pixels constitutes an $n^{th}$ unit. Each unit includes two scan lines; that is, the first unit includes two scan lines G1 and G2, and the second unit includes two scan lines G3 and G4, and so on, and the $n^{th}$ unit includes two scan lines G(2n-1) and G2n. Two scan lines in the same unit are conducted simultaneously. Sub-pixels in the same column and in the same unit are connected to the same data line, while two adjacent columns of sub-pixels in the same unit are connected to different data lines. For example, the first column of sub-pixels in the first unit is connected to the same data line S2, the second column of sub-pixels in the first unit is connected to the same data line S3, the $m^{th}$ column of sub-pixels in the first unit is connected to the same data line S(m+1), the first column of sub-pixels in the second unit is connected to the same data line S1, the second column of sub-pixels in the second unit is connected to the same data line S2, and the $m^{th}$ column of sub-pixels in the second unit is connected to the same data line Sm. Sub-pixels in the same column but respectively in two adjacent units are connected to different data lines. For example, the first column of sub-pixels in the first unit is connected to the data line S2, while the first column of sub-pixels in the second unit is connected to the data line S1. In the embodiment, scan signals are inputted to the scan lines G1 and G2 of the first unit at the same time, such that the first row of sub-pixels and the second row of sub-pixels are conducted to receive data signals from the data lines; then, signal inputting to the two scan lines G1 and G2 of the first unit is stopped, and scan signals are inputted to the scan lines G3 and G4 of the second unit at the same time, such that the third row of sub-pixels and the fourth row of sub-pixels are conducted to receive data signals from the data lines. In the embodiment, columns of sub-pixels of each odd-numbered unit among the n units are sequentially electrically connected to the data lines in an order from a second data line to an $(m+1)^{th}$ data line, and columns of sub-pixels of each even-numbered unit among the n units are sequentially electrically connected to the data lines in an order from a first data line to an $m^{th}$ data line. When two scan lines in the same unit are conducted at the same time, data signals are inputted to the plural data lines S1, S2, S3, ..., S(m+1) at the same time. In the n units, when the scan lines of an odd-numbered unit are conducted, a data signal with a gray level of 0 is inputted to the first data line S1 although the sub-pixels connected to the first data line S1 are not conducted to receive the gray level inputted to the first data line S1; when the scan lines of an even-numbered unit are conducted, a data signal with a gray level of 0 is inputted to the $(m+1)^{th}$ data line S(m+1) although the sub-pixels connected to the $(m+1)^{th}$ data line S(m+1) are not conducted to receive the gray level inputted to the $(m+1)^{th}$ data line S(m+1). The plural data lines S1, S2, S3, ..., S(m+1), the plural scan lines G1, G2, G3, ..., G2n and the plural sub-pixels are in the display area of the array substrate. In the embodiment, the plural sub-pixels include red pixels (R), green pixels (G) and blue pixels (B), while in another embodiment, the plural sub-pixels may include red pixels (R), green pixels (G), blue pixels (B) and white pixels (W).

As can be seen from above, in the array substrate according to the embodiments of the present invention, every two rows of sub-pixels constitutes a unit. By conducting two scan lines in a unit at the same time, disconnecting the two scan lines in the unit, and then conducting two scan lines in a next unit at the same time, and by transmitting the same data signal to two sub-pixels in the same column and in the same unit according to the embodiments of the present invention, data signals can be correctly transmitted to the sub-pixels of the same color, thereby overcoming cross interferences and enhancing 3D display quality of the liquid crystal panel.

Figure 2:
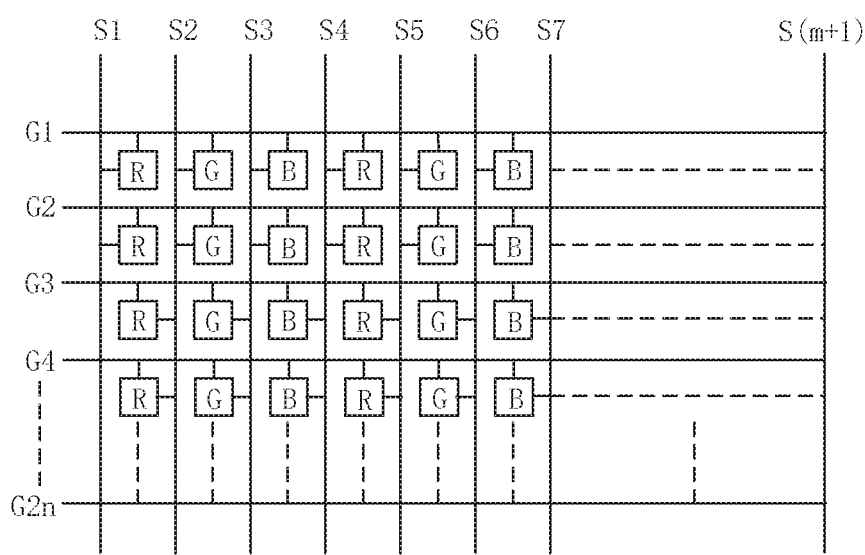
FIG. 2 is a schematic structure diagram of an array substrate according to a second embodiment of the present invention.

Please refer to FIG. 2, FIG. 2 is a schematic structure diagram of an array substrate in accordance with a second embodiment of the present invention. As shown in FIG. 2, the array substrate includes 2n scan lines G1, G2, G3, ..., G2n, m+1 data lines S1, S2, S3, ..., S(m+1) and m columns of sub-pixels that are arranged in a matrix and are defined by the scan lines G1, G2, G3, ..., G2n and the data lines S1, S2, S3, ..., S(m+1). The sub-pixels are divided into units each having two rows of sub-pixels; that is, a first row of sub-pixels and a second row of sub-pixels constitutes a first unit, and a third row of sub-pixels and a fourth row of sub-pixels constitutes a second unit, and so on, and a $(2n-1)^{th}$ row of sub-pixels and a $(2n)^{th}$ row of sub-pixels constitutes an $n^{th}$ unit. Each unit includes two scan lines; that is, the first unit includes two scan lines G1 and G2, and the second unit includes two scan lines G3 and G4, and so on, and the $n^{th}$ unit includes two scan lines G(2n-1) and G2n. Two scan lines in the same unit are conducted at the same time. Sub-pixels in the same column and in the same unit are connected to the same data line. For example, the first column of sub-pixels in the first unit is connected to the same data line S1, the second column of sub-pixels in the first unit is connected to the same data line S2, the $m^{th}$ column of sub-pixels in the first unit is connected to the same data line Sm, the first column of sub-pixels in the second unit is connected to the same data line S2, the second column of sub-pixels in the second unit is connected to the same data line S3, and the $m^{th}$ column of sub-pixels in the second unit is connected to the same data line S(m+1). Sub-pixels in the same column but respectively in two adjacent units are connected to different data lines. For example, the second column of sub-pixels in the first unit is connected to the data line S2, while the second column of sub-pixels in the second unit is connected to the data line S3. In the embodiment, scan signals are inputted to the scan lines G1 and G2 of the first unit at the same time, such that the first row of sub-pixels and the second row of sub-pixels are conducted to receive data signals from the data lines; then, signal inputting to the two scan lines G1 and G2 of the first unit is stopped, and scan signals are inputted to the scan lines G3 and G4 of the second unit at the same time, such that the third row of sub-pixels and the fourth row of sub-pixels are conducted to receive data signals from the data lines. In the embodiment, columns of sub-pixels of each odd-numbered unit among the n units are sequentially electrically connected to the data lines in an order from a first data line to an $m^{th}$ data line, and columns of sub-pixels of each even-numbered unit among the n units are sequentially electrically connected to the data lines in an order from a second data line to an $(m+1)^{th}$ data line. When two scan lines corresponding to each unit are conducted at the same time, data signals are inputted to the plural data lines S1, S2, S3, ..., S(m+1) at the same time. In the n units, when the scan lines of an odd-numbered unit are conducted, a data signal with a gray level of 0 is inputted to the $(m+1)^{th}$ data line S(m+1) although the sub-pixels connected to the $(m+1)^{th}$ data line S(m+1) are not conducted to receive the gray level inputted to the $(m+1)^{th}$ data line S(m+1); when the scan lines corresponding to the even-numbered units are conducted, a data signal with a gray level of 0 is inputted to the first data line S1 although the sub-pixels connected to the first data line S1 are not conducted to receive the gray level inputted to the first data line S1. The plural data lines S1, S2, S3, . . . , S(m+1), the plural scan lines G1, G2, G3, . . . , G2n and the plural sub-pixels are in the display area of the array substrate. In the embodiment, the plural sub-pixels include red pixels (R), green pixels (G) and blue pixels (B), while in another embodiment, the plural sub-pixels may include red pixels (R), green pixels (G), blue pixels (B) and white pixels (W).

As can be seen from the above, in the array substrate according to the embodiments of the present invention, every two rows of sub-pixels constitutes a unit. By conducting two scan lines in a unit at the same time, disconnecting the two scan lines in the unit, and then conducting two scan lines in a next unit at the same time, and by transmitting the same data signal to two sub-pixels in the same column and in the same unit according to the embodiments of the present invention, data signals can be correctly transmitted to the sub-pixels of the same color, thereby overcoming cross interferences and enhancing 3D display quality of the liquid crystal panel.

Figure 3:
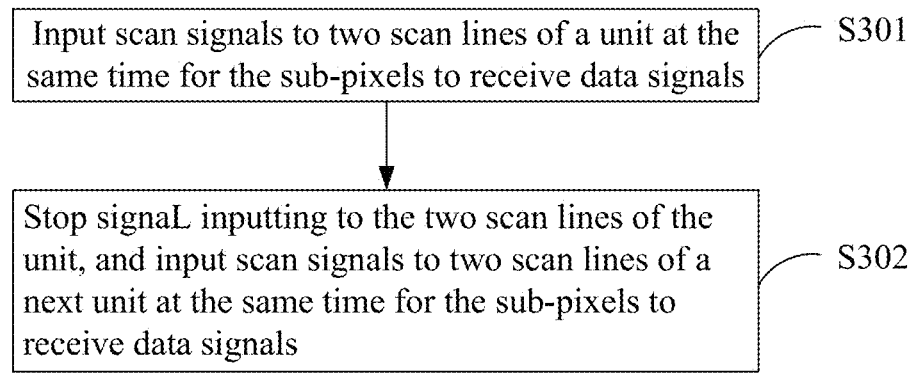
FIG. 3 is a schematic flowchart of a driving method of an array substrate according to an embodiment of the present invention.

Please refer to FIG. 3, FIG. 3 is a schematic flowchart of a method of driving an array substrate according to one embodiment of the present invention. In the following, the detailed process of the method is described in conjunction with FIGS. 1-3.

In step S301, scan signals are simultaneously inputted to two scan lines of a unit for the sub-pixels to receive data signals.

In one particular embodiment, as shown in FIG. 1, the sub-pixels of the array substrate sequentially form n units and are sequentially arranged into m rows, and the data lines are sequentially arranged into (m+1) rows, where m and n are all integers larger than or equal to 2. Scan signals are inputted to the two scan lines G1 and G2 of the first unit to conduct the scan lines G1 and G2 at the same time, and data signals are inputted to the plural data lines S1, S2, S3, . . . , S(m+1) at the same time. For example, the scan lines G1 and G2 are conducted at the same time, and data signals of gray levels respectively being 10, 8, 27, 16, . . . are inputted to the data lines S1, S2, S3, S4, . . . at the same time, such that the first row of sub-pixels, the second row of sub-pixels, the third row of sub-pixels, . . . in the first unit respectively obtain the data signals of gray levels respectively being 8, 27, 16, . . . . The sub-pixels of each odd-numbered unit are neither connected with the first data line S1, and therefore, when the scan lines of an odd-numbered unit are conducted, the data signal with a gray level of 10 inputted to the first data line S1 is not shown. In another particular embodiment, a data signal with a gray level from 0 to 255 and other than 10 may be inputted to the first data line S1 before the scan lines of an odd-numbered unit are conducted.

In another particular embodiment, as shown in FIG. 2, the sub-pixels of the array substrate sequentially form n units and are sequentially arranged into m rows, and the data lines are sequentially arranged into (m+1) rows, where m and n are all integers larger than or equal to 2. Scan signals are inputted to the two scan lines G1 and G2 of the first unit to conduct the scan lines G1 and G2 at the same time, and data signals are inputted to the plural data lines S1, S2, S3, . . . , S(m+1) at the same time. For example, the scan lines G1 and G2 are conducted at the same time, and data signals of gray levels respectively being 10, 8, 27, 16, . . . are inputted to the data lines S1, S2, S3, S4, . . . at the same time, such that the first row of sub-pixels, the second row of sub-pixels, the third row of sub-pixels, the fourth row of sub-pixels, in the first unit respectively obtain the data signals of gray levels respectively being 10, 8, 27, 16 . . . . In another particular embodiment, scan signals are inputted to the two scan lines G1 and G2 corresponding to the first unit simultaneously to conduct the scan lines G1 and G2 at the same time, and data signals of gray levels respectively being 10, 8, 27, 16, . . . are inputted to the data lines S(m+1), Sm, S(m−1), S(m−2), . . . at the same time, such that the $(m+1)^{th}$ column of sub-pixels, the $m^{th}$ column of sub-pixels, the $(m-1)^{th}$ column of sub-pixels, the $(m-2)^{th}$ column of sub-pixels, . . . in the first unit respectively obtain the data signals of gray levels respectively being 10, 8, 27, 16, . . . . The sub-pixels of each odd-numbered unit are neither connected with the $(m+1)^{th}$ data line S(m+1), and therefore, when the scan lines of an odd-numbered unit are conducted, the data signal with a gray level of 10 inputted to the $(m+1)^{th}$ data line S(m+1) is not shown. In another particular embodiment, a data signal with a gray level from 0 to 255 and other than 10 may be inputted to the $(m+1)^{th}$ data line before the scan lines of an odd-numbered unit are conducted.

In step S302, signal inputting to the two scan lines corresponding to the unit is stopped, and scan signals are inputted to two scan lines of a next unit at the same time for the sub-pixels to receive data signals.

In one particular embodiment, as shown in FIG. 1, in step S301, the scan lines G1 and G2 are conducted at the same time, and data signals of gray levels respectively being 10, 8, 27, 16, . . . are inputted to the data lines S1, S2, S3, S4, . . . at the same time, such that the first row of sub-pixels, the second row of sub-pixels, the third row of sub-pixels, . . . in the first unit respectively obtain the data signals of gray levels respectively being 8, 27, 16, . . . . In step S302, scan signal inputting to the two scan lines G1 and G2 of the first unit is stopped, i.e., the scan lines G1 and G2 are disconnected at the same time, and scan signals are inputted to the two scan lines G3 and G4 of the second unit to conduct the scan lines G3 and G4 at the same time, and data signals of gray levels respectively being 23, 57, 88, 99, . . . are inputted to the data lines S1, S2, S3, S4, . . . , such that the first row of sub-pixels, the second row of sub-pixels, the third row of sub-pixels, the fourth row of sub-pixels, . . . in the second unit respectively obtain the data signals of gray levels respectively being 23, 57, 88, 99, . . . . In another particular embodiment, the scan lines G3 and G4 are conducted at the same time, and data signals of gray levels respectively being 23, 57, 88, 99, . . . , are inputted to the data lines S(m+1), Sm, S(m−1), S(m−2), . . . at the same time, such that the $(m+1)^{th}$ column of sub-pixels, the $m^{th}$ column of sub-pixels, the $(m-1)^{th}$ column of sub-pixels, the $(m-2)^{th}$ column of sub-pixels, . . . in the second unit respectively obtain the data signals of gray levels respectively being 23, 57, 88, 99, . . . . The sub-pixels of each even-numbered unit are neither connected with the $(m+1)^{th}$ data line S(m+1), and therefore, when the scan lines of an even-numbered unit are conducted, the data signal with a gray level of 23 inputted to the $(m+1)^{th}$ data line S(m+1) is not shown. In another particular embodiment, a data signal with a gray level from 0 to 255 and other than 23 may be inputted to the $(m+1)^{th}$ data line S(m+1) before the scan lines of an even-numbered unit are conducted.

In another particular embodiment, as shown in FIG. 2, in step S301, the scan lines G1 and G2 are conducted at the same time, and data signals of gray levels respectively being 10, 8, 27, 16, ... are inputted to the data lines S1, S2, S3, S4, ... at the same time, such that the first row of sub-pixels, the second row of sub-pixels, the third row of sub-pixels, ... in the first unit respectively obtain the data signals of gray levels respectively being 8, 27, 16, .... In step S302, scan signal inputting to the two scan lines G1 and G2 of the first unit is stopped, i.e., the scan lines G1 and G2 are disconnected at the same time, and scan signals are inputted to the two scan lines G3 and G4 of the second unit to conduct the scan lines G3 and G4 at the same time, and data signals of gray levels respectively being 23, 57, 88, 99, ... are inputted to the data lines S1, S2, S3, S4, ..., such that the first row of sub-pixels, the second row of sub-pixels, the third row of sub-pixels, ... in the second unit respectively obtain the data signals of gray levels respectively being 57, 88, 99, .... The sub-pixels of each even-numbered unit are neither connected with the first data line S1, and therefore, when the scan lines of an even-numbered unit are conducted, the data signal with a gray level of 23 inputted to the first data line S1 is not shown. In another particular embodiment, a data signal with a gray level from 0 to 255 and other than 23 may be inputted to the first data line S1 before the scan lines of an even-numbered unit are conducted.

The above steps are repeated to sequentially input data signals to the sub-pixels in each unit, thereby achieving the goal of 3D display.

Figure 4:
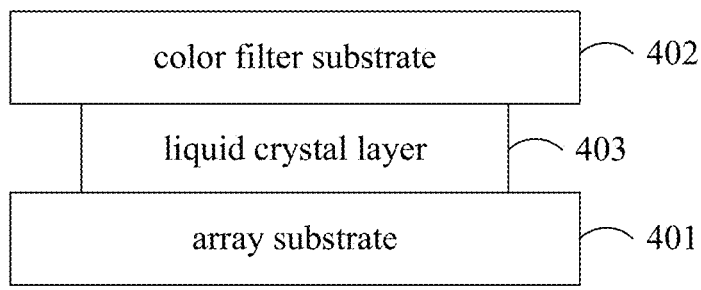
FIG. 4 is a schematic structure diagram of a liquid crystal panel according to an embodiment of the present invention.

Please refer to FIG. 4, FIG. 4 is a schematic structure diagram of a liquid crystal panel according to one embodiments of the present invention. As shown in FIG. 4, the liquid crystal panel includes an array substrate 401, a color filter substrate 402 and a liquid crystal layer 403 that is disposed between the array substrate 401 and the color filter substrate 402, in which the array substrate 401 is the array substrate of any embodiment mentioned above.

In comparison with the prior art technology, in the array substrate according to the embodiments of the present invention, every two rows of sub-pixels constitutes a unit. By conducting two scan lines in a unit at the same time, disconnecting the two scan lines in the unit, and then conducting two scan lines in a next unit at the same time, and by transmitting the same data signal to two sub-pixels in the same column and in the same unit according to the embodiments of the present invention, data signals can be correctly transmitted to the sub-pixels of the same color, thereby overcoming cross interferences and enhancing 3D display quality of the liquid crystal panel.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An array substrate comprising a plurality of scan lines, a plurality of data lines and a plurality of sub-pixels that are arranged in a matrix and are defined by the scan lines and the data lines, wherein every two rows of sub-pixels constitutes a unit, sub-pixels in the same column and in the same unit are connected to the same data line, sub-pixels in the same column but respectively in two adjacent units are connected to different data lines, two adjacent columns of sub-pixels in the same unit are connected to different data lines, and two scan lines in the same unit are conducted at the same time, wherein, a data signal is inputted to one of the data lines although sub-pixels connected to the one of the data lines all are not conducted;

wherein the sub-pixels sequentially form n units, and the sub-pixels are sequentially arranged in m columns, and the data lines are sequentially arranged in m+1 columns, wherein each of m and n is an integer larger than or equal to 2, wherein in the n units, columns of sub-pixels of each odd-numbered unit are sequentially electrically connected to the data lines in an order from a second data line to an $(m+1)^{th}$ data line, and columns of sub-pixels of each even-numbered unit are sequentially electrically connected to the data lines in an order from a first data line to an $m^{th}$ data line;

wherein in the n units, when the scan lines of one of the odd-numbered units are conducted, the data signal with a gray level from 0 to 255 is inputted to the first data line, and when the scan lines of one of the even-numbered units are conducted, the data signal with a gray level from 0 to 255 is inputted to the $(m+1)^{th}$ data line.

2. The array substrate according to claim 1, wherein the sub-pixels comprise red pixels, green pixels and blue pixels.

3. The array substrate according to claim 1, wherein the sub-pixels comprise red pixels, green pixels, blue pixels and white pixels.

4. A method of driving an array substrate, the array substrate having a plurality of scan lines, a plurality of data lines and a plurality of sub-pixels that are arranged in a matrix and are defined by the scan lines and the data lines, every two rows of sub-pixels constituting a unit, sub-pixels in the same column and in the same unit connected to the same data line, sub-pixels in the same column but respectively in two adjacent units connected to different data lines, and two adjacent columns of sub-pixels in the same unit connected to different data lines, wherein the method comprises:

inputting scan signals to two scan lines of one of the units at the same time for the sub-pixels to receive data signals; and stopping signal inputting to the two scan lines of the one of the units, and inputting scan signals to two scan lines of a next one of the units at the same time for the sub-pixels to receive data signals, wherein, a data signal is inputted to one of the data lines although sub-pixels connected to the one of the data lines all are not conducted;

wherein the sub-pixels sequentially form n units, and the sub-pixels are sequentially arranged in m columns, and the data lines are sequentially arranged in m+1 columns, wherein each of m and n is an integer larger than or equal to 2;

wherein in the n units, columns of sub-pixels of each odd-numbered unit are sequentially electrically connected to the data lines in an order from a second data line to an $(m+1)^{th}$ data line, and columns of sub-pixels of each even-numbered unit are sequentially electrically connected to the data lines in an order from a first data line to an $m^{th}$ data line;

wherein in the n units, when the scan lines corresponding to one of the odd-numbered units are conducted, the data signal with a gray level from 0 to 255 is inputted to the first data line, and when the scan lines corresponding to one of the even-numbered units are conducted, the data signal with a gray level from 0 to 255 is inputted to the $(m+1)^{th}$ data line.

5. A liquid crystal panel comprising an array substrate that comprises a plurality of scan lines, a plurality of data lines and a plurality of sub-pixels that are arranged in a matrix and are defined by the scan lines and the data lines, wherein every two rows of sub-pixels constitutes a unit, sub-pixels in the same column and in the same unit are connected to the same data line, sub-pixels in the same column but respectively in two adjacent units are connected to different data lines, two adjacent columns of sub-pixels in the same unit are connected to different data lines, and two scan lines in the same unit are conducted at the same time, wherein, a data signal is inputted to one of the data lines although sub-pixels connected to the one of the data lines all are not conducted;

wherein the sub-pixels sequentially form n units, and the sub-pixels are sequentially arranged in m columns, and the data lines are sequentially arranged in m+1 columns, wherein each of m and n is an integer larger than or equal to 2;

wherein in the n units, columns of sub-pixels of each odd-numbered unit are sequentially electrically connected to the data lines in an order from a second data line to an $(m+1)^{th}$ data line, and columns of sub-pixels of each even-numbered unit are sequentially electrically connected to the data lines in an order from a first data line to an $m^{th}$ data line, wherein in the n units, when the scan lines of one of the odd-numbered units are conducted, the data signal with a gray level from 0 to 255 is inputted to the first data line, and when the scan lines of one of the even-numbered units are conducted, the data signal with a gray level from 0 to 255 is inputted to the $(m+1)^{th}$ data line.

* * * * *